United States Patent [19]

Misaizu

[11] 4,446,387
[45] * May 1, 1984

[54] MOS INVERTER-BUFFER CIRCUIT HAVING A SMALL INPUT CAPACITANCE

[75] Inventor: Tetsuo Misaizu, Tokyo, Japan

[73] Assignee: Nippon Electric Co., Ltd., Tokyo, Japan

[*] Notice: The portion of the term of this patent subsequent to Apr. 28, 1998 has been disclaimed.

[21] Appl. No.: 215,729

[22] Filed: Dec. 12, 1980

Related U.S. Application Data

[63] Continuation of Ser. No. 39,850, May 17, 1979, Pat. No. 4,264,829.

[30] Foreign Application Priority Data

May 22, 1978 [JP] Japan .................. 53-61491

[51] Int. Cl.³ .............. H03K 19/017; H03K 19/094; H03K 19/20
[52] U.S. Cl. .................. 307/450; 307/475
[58] Field of Search ............ 307/440, 445, 448, 449, 307/450, 463, 475, 264, 270; 365/189, 230

[56] References Cited

U.S. PATENT DOCUMENTS

| | | | |
|---|---|---|---|
| 3,428,903 | 2/1969 | Forslund et al. | 307/445 X |
| 3,649,843 | 3/1972 | Redwine et al. | 307/214 |
| 3,806,738 | 4/1974 | Chin et al. | 307/DIG. 4 X |
| 3,937,983 | 2/1976 | Reed | 307/482 |
| 3,946,369 | 3/1976 | Pashley | 307/475 X |
| 4,042,839 | 8/1977 | Araki | 307/270 |
| 4,071,783 | 1/1978 | Knepper | 307/482 X |
| 4,096,398 | 6/1978 | Khaitan | 307/DIG. 1 X |
| 4,101,788 | 7/1978 | Baker | 307/DIG. 1 X |
| 4,103,189 | 7/1978 | Perlegos et al. | 307/463 X |
| 4,133,611 | 1/1979 | Baker | 307/450 X |

OTHER PUBLICATIONS

Knepper, "Dynamic Depletion Mode: An E/D MOSFET Circuit Method for Improved Performance", IEEE-JSSC, vol. SC. 13, No. 5, 10/78.

Knepper, "Enhancement/Depletion Mode Field-Effect Transistor Driver", IBM Tech. Discl. Bull., vol. 19, No. 3, pp. 922-923, 8/76.

Kelahanty et al., "Depletion-Mode FET Load Devices Switched with Positive Signal Voltage Levels", IBM Tech. Discl. Bull., vol. 19, No. 7, p. 26/2, 12/76.

Chu et al., "Bootstrap Push-Pull Driver", IBM Tech. Discl. Bull., vol. 18, No. 3, pp. 710-711, 8/75.

Love, "In-Phase Weak-Signal Input Circuit", IBM Tech. Discl. Bull., vol. 19, No. 12, p. 4673, 5/77.

Primary Examiner—Larry N. Anagnos
Attorney, Agent, or Firm—Laff, Whitesel, Conte & Saret

[57] ABSTRACT

For preventing an input signal supplied to an input terminal (A) from directly affecting an inverted signal derived at a node (15), an inverter stage of an inverter-buffer circuit composed of MOS transistors comprises two additional partial inverter stages ($Q_6$-$Q_5$ and $Q_7$-$Q_8$) between a buffer stage ($Q_3$-$Q_4$) and a conventional inverter stage ($Q_1$-$Q_2$) that serves now as an input-side partial inverter stage. The buffer stage favorably comprises an additional MOS transistor ($Q_9$) having a gate connected directly to the node in order to achieve a short switching delay.

10 Claims, 5 Drawing Figures

MOS INVERTER-BUFFER CIRCUIT HAVING A SMALL INPUT CAPACITANCE

This is a continuation of application Ser. No. 039,850 filed May 17, 1979 and now U.S. Pat. No. 4,264,829.

BACKGROUND OF THE INVENTION

This invention relates to an inverter-buffer circuit composed of a certain number of metal-oxide(insulator)-semiconductor field-effect transistors (herein abbreviated to MOS transistors), each having an insulated-gate. This invention is specifically adapted to an inverter-buffer circuit, comprised by an MOS integrated circuit, for converting a TTL (transistor-transistor logic) input signal to an output signal of the MOS level.

As will be described later with reference to a few of several figures of the accompanying drawing, an inverter-buffer circuit of the type described is already known. A known circuit, however, is still defective in that the output signal is adversely affected directly by the input signal and that the input capacitance is considerably large.

SUMMARY OF THE INVENTION

It is therefore an object of the present invention to provide an inverter-buffer circuit composed of a plurality of insulated-gate MOS transistors, capable of producing an output signal that is little adversely affected directly by an input signal.

It is another object of this invention to provide an inverter-buffer circuit of the type described, which has a small input capacitance.

An inverter-buffer circuit to which this invention is applicable comprises an inverter stage between a signal input terminal and a first and a second intermediate terminal and between a power supply terminal and a point of a common potential and a buffer stage between the intermediate terminals and a signal output terminal and between the power supply terminal and the common potential point. The inverter stage includes a first MOS transistor of the enhancement type having a gate connected to the input terminal and operatively coupled to the first intermediate terminal, a source connected to the common potential point, and a drain connected to a node operatively coupled, in turn, to the second intermediate terminal and a second MOS transistor of the depletion type having a gate connected to the node, a source connected also to the node, and a drain connected to the power supply terminal. The buffer stage comprises a third MOS transistor of the enhancement type having a gate connected to the first intermediate terminal, a source connected to the common potential point, and a drain connected to the output terminal and a fourth MOS transistor of the enhancement type having a gate connected to the second intermediate terminal, a source connected to the output terminal, and a drain connected to the power supply terminal. According to this invention, the inverter stage comprises a fifth MOS transistor of the depletion type having a gate connected to the input terminal, a source connected to the first intermediate terminal, and a drain connected to the power supply terminal, a sixth MOS transistor of the enhancement type having a gate connected to the node, a source connected to the common potential point, and a drain connected to the first intermediate terminal, a seventh MOS transistor of the enhancement type having a gate connected to the first intermediate terminal, a source connected to the common potential point, and a drain connected to the second intermediate terminal, and an eighth MOS transistor of the depletion type having an insulated gate connected to the node, a source connected to the second intermediate terminal, and a drain connected to the power supply terminal.

DESCRIPTION OF THE PREFERRED EMBODIMENTS

Figure 1:
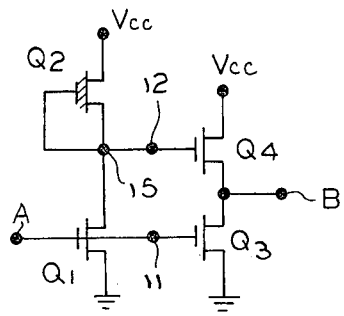
FIG. 1 illustrates a conventional inverter-buffer circuit composed of a certain number of MOS transistors.

Referring to FIG. 1, a conventional inverter-buffer circuit will be described at first in order to facilitate an understanding of the present invention. The inverter-buffer circuit comprises an inverter stage between a signal input terminal A and first and second intermediate terminals 11 and 12 and between a power supply terminal $V_{cc}$ and a point of a common potential depicted as ground. A buffer stage of the circuit is connected between the intermediate terminals 11 and 12 and a signal output terminal B and between the power supply terminal $V_{cc}$ and the common potential point. The inverter stage comprises a first MOS transistor $Q_1$ of the enhancement type having a gate connected to the input terminal A and to the first intermediate terminal 11, a source connected to the common potential point, and a drain connected to a node 15 that serves as a stage output terminal for an inverted signal and is connected, in turn, to the second intermediate terminal 12. The inverter stage further comprises a second MOS transistor $Q_2$ of the depletion type having a gate connected to the node 15, a source connected also to the node 15, and a drain connected to the power supply terminal $V_{cc}$. The buffer stage comprises a third MOS transistor $Q_3$ of the enhancement type having a gate connected to the first intermediate terminal 11, a source connected to the common potential point, and a drain connected to the output terminal 3 and a fourth MOS transistor $Q_4$ of the enhancement type havng a gate connected to the second intermediate terminal 12, a source connected to the output terminal B, and a drain connected to the power supply terminal $V_{cc}$.

Figure 2:
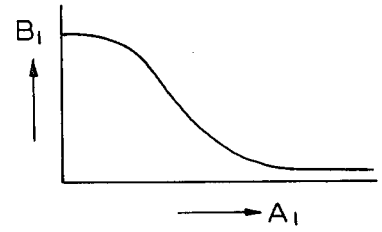
FIG. 2 schematically shows an input-output characteristic of the conventional inverter-buffer circuit.

In the circuit exemplified in FIG. 1, it is known that the first MOS transistor $Q_1$ should have much greater width-to-length ratio than the second MOS transistor $Q_2$ as discussed in, for example, U.S. Pat. No. 3,649,843 by Donald J. Redwine et al. This is in order to keep the node 15 at a low potential when the input terminal A is supplied with an input signal $A_1$ of a high level. The input signal $A_1$ is liable to directly adversely affect an output signal $B_1$ delivered to the output terminal B as exemplified in FIG. 2. More specifically, the output signal $B_1$ is not kept at a sufficiently high level when the lower level of the input signal $A_1$ is higher than the threshold level of the first MOS transistor $Q_1$. Inasmuch as the first MOS transistor $Q_1$ has a wide area, the input signal $A_1$ suffers from a large input capacitance due to transistors $Q_1$ $Q_3$ although the width-to-length ratios of the third and the fourth MOS transistors $Q_3$ and $Q_4$ are immaterial.

Figure 3:
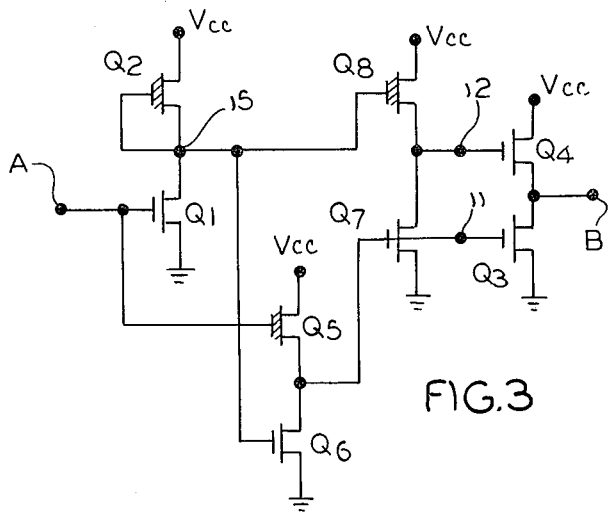
FIG. 3 illustrates an inverter-buffer circuit according to a first embodiment of the instant invention.

Referring now to FIG. 3, an inverter-buffer circuit according to a first embodiment of this invention comprises similar parts designated by like reference numerals as in FIG. 1. The gate of the first MOS transistor $Q_1$ and the node 15 are not directly connected to the first and the second intermediate terminals 11 and 12, respectively. The inverter stage comprises a fifth MOS transistor $Q_5$ of the depletion type having a gate connected to the input terminal A, a source connected to the first intermediate terminal 11, and a drain connected to the power supply terminal $V_{cc}$. A sixth MOS transistor $Q_6$ of the enhancement type has a gate connected to the node 15, a source connected to the common potential point, and a drain connected to the first intermediate terminal 11. A seventh MOS transistor $Q_7$ of the enhancement type has a gate connected to the first intermediate terminal 11, a source connected to the common potential point, and a drain connected to the second intermediate terminal 12. An eighth MOS transistor $Q_8$ of the depletion type has a gate connected to the node 15, a source connected to the second intermediate terminal 12, and a drain connected to the power supply terminal $V_{cc}$.

In the circuit depicted in FIG. 3, each pair of the first and the second MOS transistors $Q_1$ and $Q_2$, the sixth and the fifth MOS transistors $Q_6$ and $Q_5$, or the seventh and the eighth MOS transistors $Q_7$ and $Q_8$ cooperates with each other to form a partial inverter stage. It is therefore necessary that the first, the sixth, and the seventh MOS transistors $Q_1$, $Q_6$, and $Q_7$ should have greater width-to-length ratios than the cooperating MOS transistors $Q_2$, $Q_5$, and $Q_8$, respectively, although the width-to-length ratios of the third and the fourth MOS transistors $Q_3$ and $Q_4$ are not critical. An output signal B' delivered to the output terminal B is little adversely affected directly by the input signal $A_1$ supplied to the input terminal A because two additional partial inverter stages $Q_6$-$Q_5$ and $Q_7$-$Q_8$ are interposed between the buffer stage $Q_3$-$Q_4$ and a conventional inverter stage $Q_1$-$Q_2$ that serves now as an input-side partial inverter stage. Inasmuch as the input signal $A_1$ is supplied to the first and the fifth MOS transistors $Q_1$ and $Q_5$, of which the latter transistor $Q_5$ can be made to have a very narrow area smaller than that of transistor $Q_3$, it is possible to markedly reduce the input capacitance. It is, however, inevitable that the illustrated inverter-buffer circuit has a switching delay somewhat longer than a conventional inverter-buffer circuit because of the two interposed partial inverter stages $Q_6$-$Q_5$ and $Q_7$-$Q_8$ through which the inverted signal is eventually supplied to the buffer stage $Q_3$-$Q_4$.

Figure 4:
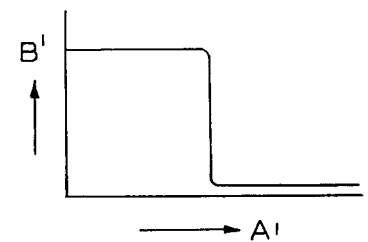
FIG. 4 diagrammatically shows an input-output characteristic of the circuit depicted in FIG. 3.

Turning to FIG. 4, an input-output characteristic of the circuit illustrated in FIG. 3 is quite excellent. More particularly, the output signal B' has a sufficiently high level even when the lower level of the input signal $A_1$ is higher than the threshold level of the first MOS transistor $Q_1$.

Figure 5:
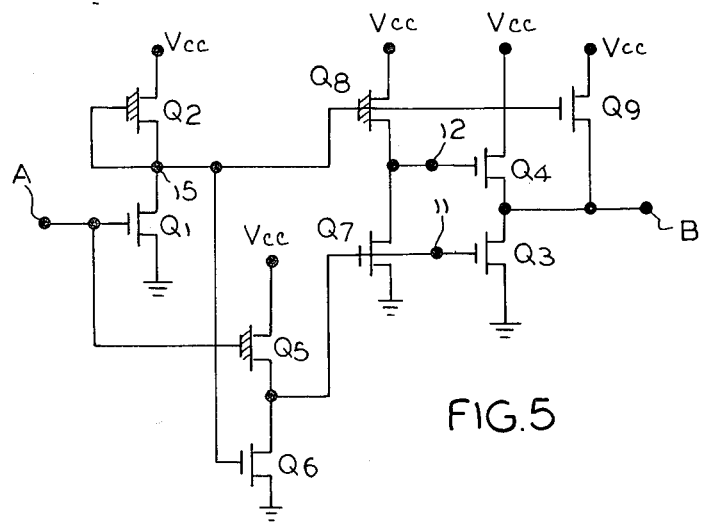
FIG. 5 shows an inverter-buffer circuit according to a second embodiment of this invention.

Finally referring to FIG. 5, an inverter-buffer circuit according to a second embodiment of this invention comprises similar parts designated by like reference symbols as in FIG. 3. The buffer stage of this circuit comprises a ninth MOS transistor $Q_9$ of the enhancement type having a gate connected directly to the node 15, a source connected to the output terminal B, and a drain connected to the power supply terminal $V_{cc}$ in addition to the third and the fourth MOS transistors $Q_3$ and $Q_4$. The ninth MOS transistor $Q_9$ need not have a great width-to-length ratio The circuit shown in FIG. 5 has the features described with reference to FIGS. 3 and 4. Furthermore, the illustrated circuit has as small a switching delay as the conventional inverter-buffer circuit because the ninth MOS transistor $Q_9$ is supplied with the inverted signal directly from the input-side partial inverter stage comprising the first and the second MOS transistors $Q_1$ and $Q_2$.

While a few embodiments of this invention have thus far been described, it is now possible for those skilled in the art to carry this invention into effect readily in various other ways. For instance, an inverter-buffer circuit according to this invention can be composed of P-channel MOS transistors rather than of N-channel MOS transistors.

What is claimed is:

1. A logic circuit comprising an input terminal for receiving an input signal, a first inverter circuit means responsive to said input signal for producing a first signal having a phase which is opposite the phase to said input signal, a second inverter means responsive to said input signal and said first signal for producing a second signal having substantially the same phase as said input signal, a third inverter circuit means responsive to said first signal and said second signal for producing a third signal having substantially the same phase as said first signal and a buffer circuit means responsive to said second signal and said third signal for producing an output signal at its output terminal.

2. The circuit according to claim 1, in which said buffer circuit means includes a first insulated gate field effect transistor having one of a drain and a source supplied with a first potential, a gate supplied with said third signal and the other of the drain and source connected to said output terminal of said buffer circuit, and a second insulated gate field effect transistor having one of the drain and source connected to said output terminal of said buffer circuit means, a gate supplied with said second signal and the other of the drain and source supplied with a second potential.

3. The circuit according to claim 2, in which said second inverter means includes a third insulated gate field effect transistor having one of a drain and a source supplied with said first potential, a gate supplied with said input signal, and a fourth insulated gate field effect transistor having one of the drain and the source coupled to the other of the drain and the source of said third transistor, a gate supplied with said first signal and the other of the drain and the source supplied with said second potential, said second signal being derived from a common junction of the other of the drain and the source of said third transistor and said one of the drain and the source of said fourth transistor.

4. The circuit according to claim 3, in which said third inverter means includes a fifth insulated gate field effect transistor having one of a drain and a source supplied with said first potential, a gate supplied with said first signal and a sixth insulated gate field effect transistor having one of the drain and the source coupled to the other of the drain and the source of said fifth transistor, a gate supplied with said second signal and the other of the drain and the source supplied with said second potential, said third signal being derived from the common junction of the other of the drain and the source of said fifth transistor and said one of the drain and the source of said sixth transistor.

5. The circuit according to claim 4, in which said third and fifth transistors are depletion type.

6. In a logic circuit including an input terminal for receiving an input signal, a first inverter means having an input coupled to said input terminal for producing an inverted signal at its output, and a buffer circuit means for producing an output logic signal based on said input signal and said inverted signal, the improvement comprising a second inverter means including a first switching transistor for receiving said inverted signal at its gate and a first load transistor having a gate, and means for connecting said gate of said first load transistor to said input terminal, a third inverter means including a second switching transistor receiving an output signal of said second inverter at its gate and a second load transistor receiving said inverted signal at its gate; first means for supplying the output signal of said second inverter means to said buffer circuit and second means for supplying the output signal of said third inverter means to said buffer circuit, whereby said buffer circuit operates in a push-pull manner.

7. The circuit according to claim 6, said first and second load transistors being depletion type transistors.

8. The circuit according to claim 1 or 6, further comprising a switching means coupled to the output terminal of said buffer circuit means and means for supplying said inverted signal to said switching means.

9. The circuit according to claim 8, in which said switching means includes an insulated gate field effect transistor having a gate receiving said inverted signal.

10. A logic circuit comprising an input terminal for receiving an input signal, first inverter circuit means coupled to said input terminal for producing at its output terminal a first signal having a phase which is opposite the phase of said input signal, second inverter circuit means coupled to the output terminal of said first inverter circuit means for producing at its output terminal a second signal having a phase which is substantially the same as the phase of said input signal, third inverter circuit means coupled to the output terminals of said first and second inverter circuit means for producing at its output terminal a third signal having a phase which is substantially the same as the phase of said first signal, and buffer circuit means coupled to the output terminals of said second and third inverter circuit means for producing an output signal at its output terminal.

* * * * *